(12) United States Patent
Laubach

(10) Patent No.: US 6,336,669 B1
(45) Date of Patent: Jan. 8, 2002

(54) PARALLEL ALIGNING QUICK DISCONNECT ARTICULATED CHUCK APPARATUS AND METHOD

(75) Inventor: Wilburn B. Laubach, Austin, TX (US)

(73) Assignee: SPM Semiconductor Products Manufacturing, Georgetown, TX (US)

( * ) Notice: Subject to any disclaimer, the term of this patent is extended or adjusted under 35 U.S.C. 154(b) by 0 days.

(21) Appl. No.: 09/602,929

(22) Filed: Jun. 23, 2000

Related U.S. Application Data

(62) Division of application No. 09/335,590, filed on Jun. 18, 1999, now Pat. No. 6,224,121.

(51) Int. Cl.⁷ .................................................. B25J 15/04
(52) U.S. Cl. ........................ 294/64.1; 294/86.4; 901/40; 901/45
(58) Field of Search ....................... 294/86.4, 64.1–64.3, 294/65; 901/40, 45, 49; 414/737, 752.1; 279/900, 904

(56) References Cited

U.S. PATENT DOCUMENTS

| | | | |
|---|---|---|---|
| 4,700,932 A | * 10/1987 | Katsuno | ...................... 901/49 |
| 4,872,718 A | * 10/1989 | Nerger | ...................... 294/86.4 |
| 5,352,086 A | * 10/1994 | Mank | ...................... 294/64.1 |
| 5,707,093 A | * 1/1998 | Nagai et al. | ............... 294/64.1 |

\* cited by examiner

Primary Examiner—Dean J. Kramer
(74) Attorney, Agent, or Firm—Rick B. Yeager

(57) ABSTRACT

In an automatic chip test machine for testing electronic components, a novel quick disconnect articulated chuck for securing a chip nest, allowing rapid changes of the chuck and plunger head with minimum production downtime. The chuck is comprised of a chuck base and a quick disconnect assembly. The quick disconnect assembly includes a vacuum seal a retractable piston with vacuum cup attachment for securing a chip, a plunger head, alignment pins, and accessible disconnect screws. The base housing is mounted in a manner that permits articulation of the chuck to allow the chuck to align with the electrical test fixture; and a vacuum introduction port. A slide frame is supported on slide rails with a roller ball and detent mechanism to permit relatively low forces of the initial mating action between the chuck and the fixture to move the chuck into a position of better alignment, and therefore lower stress and wear.

6 Claims, 20 Drawing Sheets

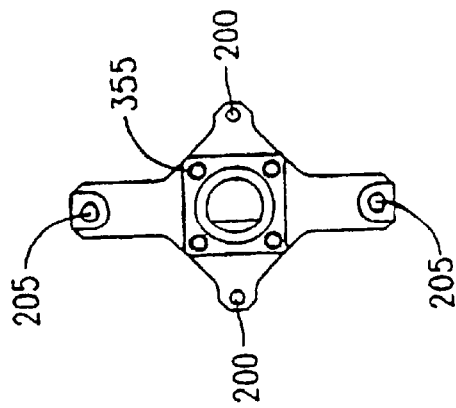
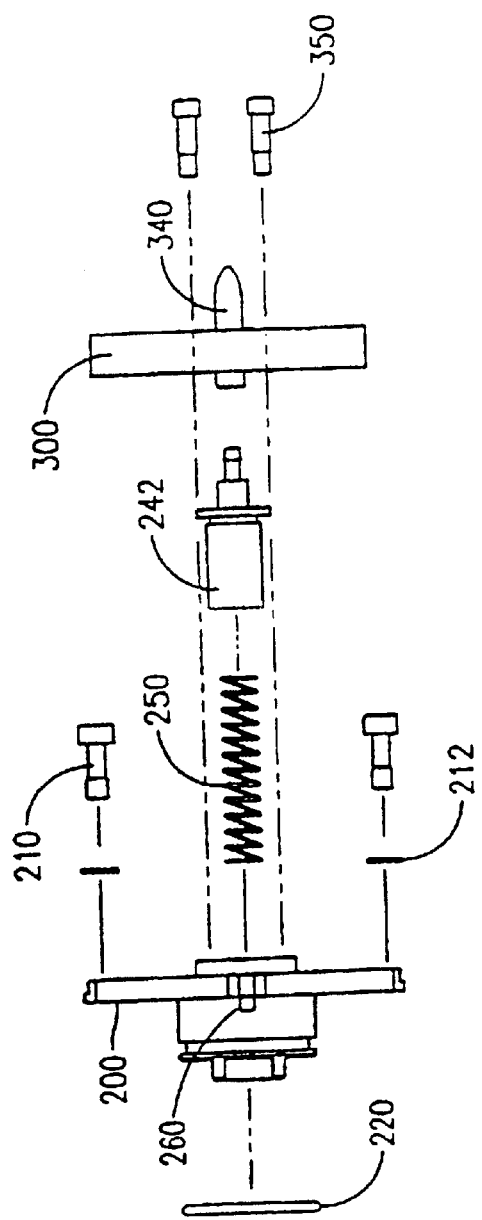
FIG. 5B
FIG. 5A

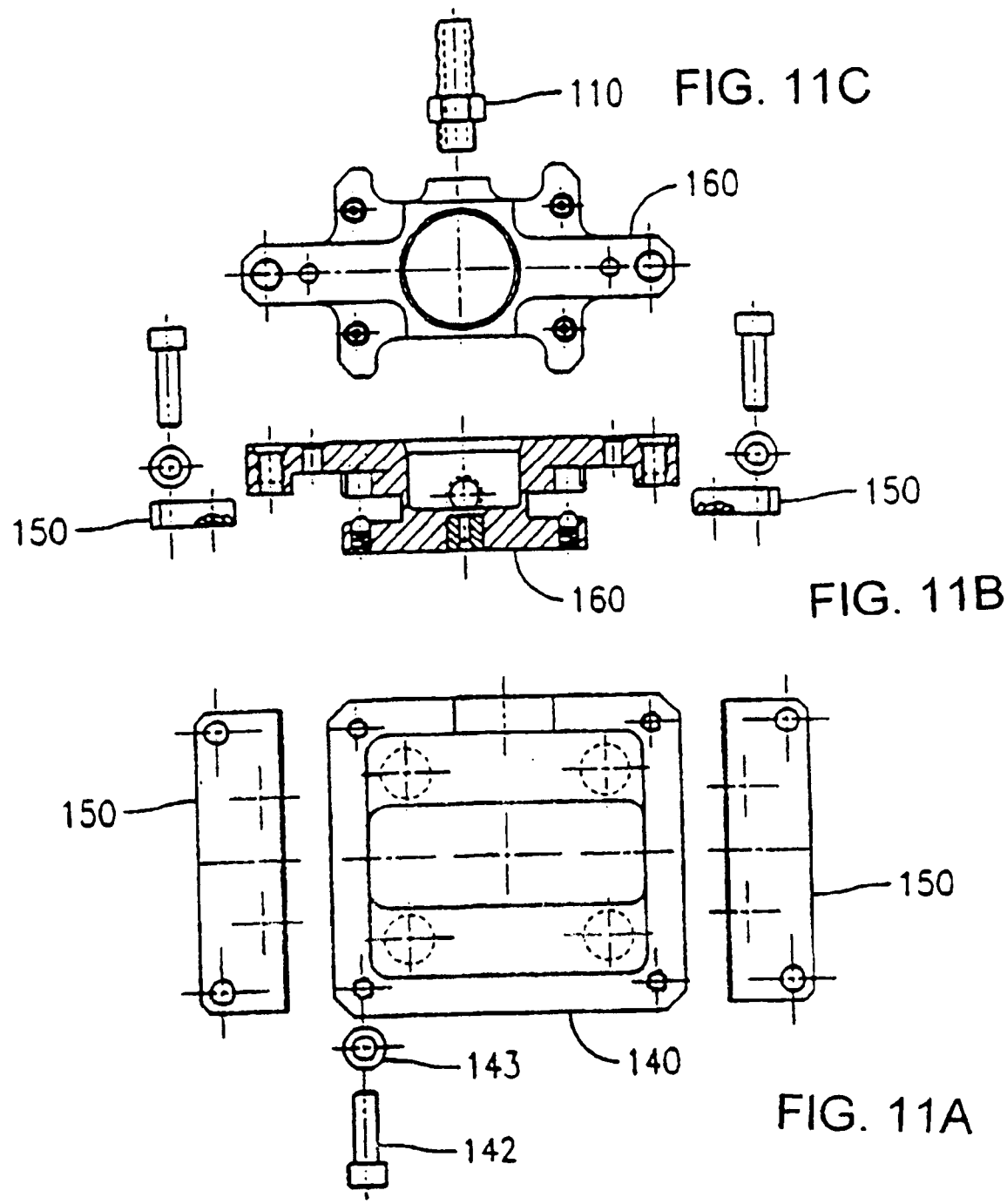

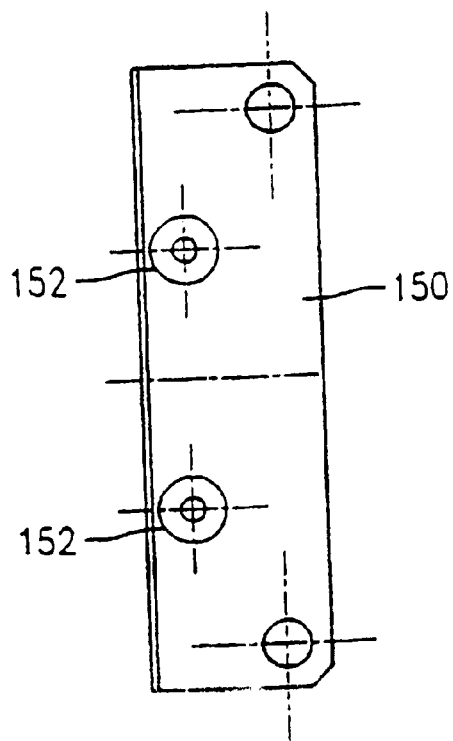
FIG. 13A
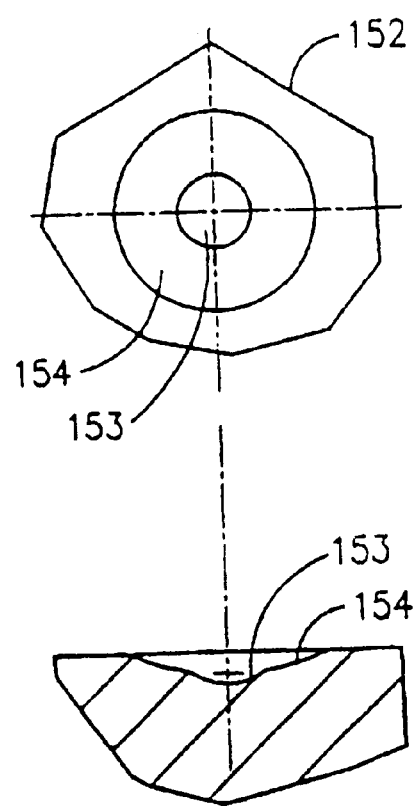
FIG. 13B
FIG. 13C

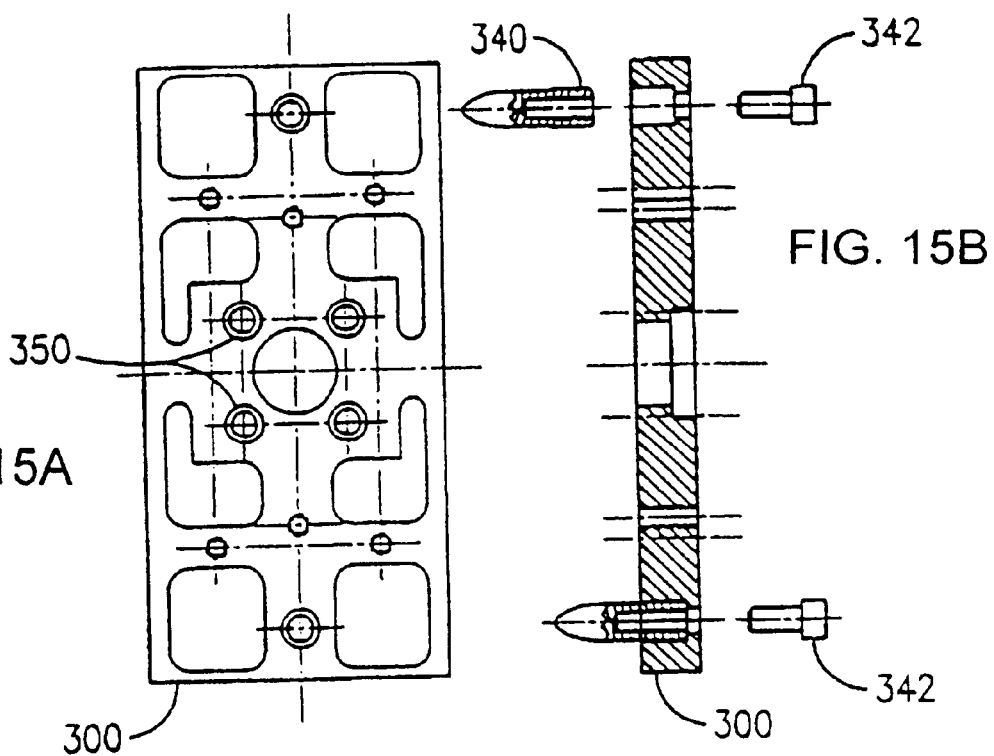
FIG. 15A
FIG. 15B
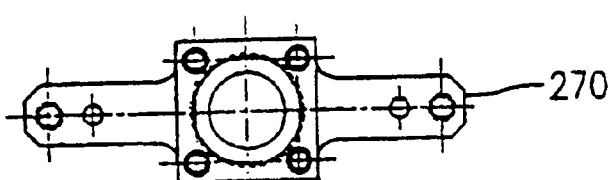
FIG. 15C
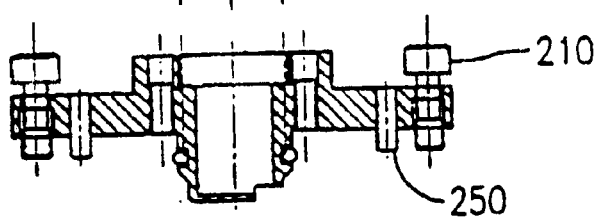
FIG. 15D
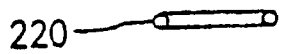

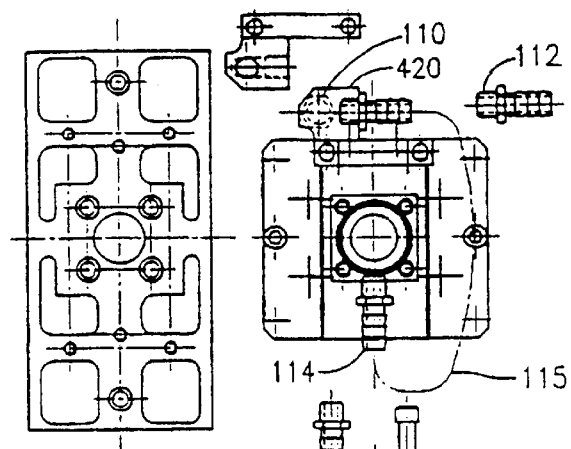
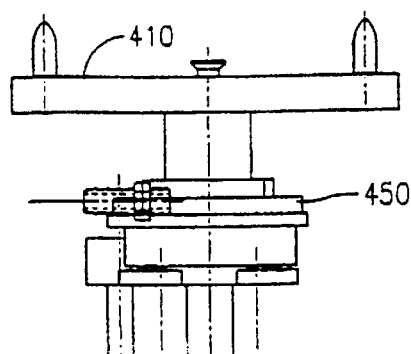
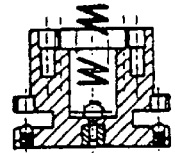
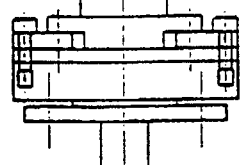
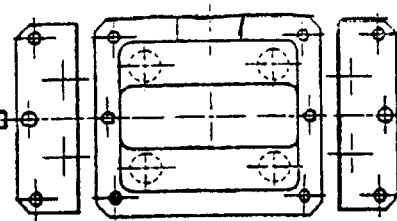
FIG. 16C
FIG. 16D
FIG. 16A
FIG. 16B
FIG. 16E

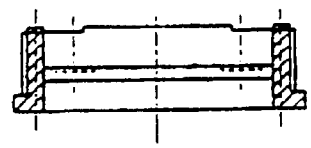
FIG. 19B
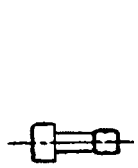 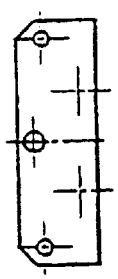 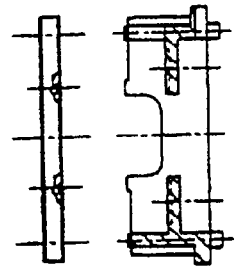 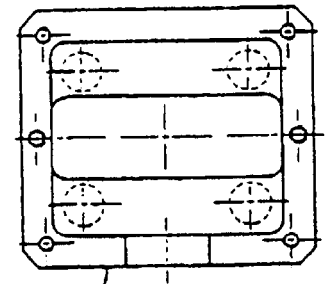 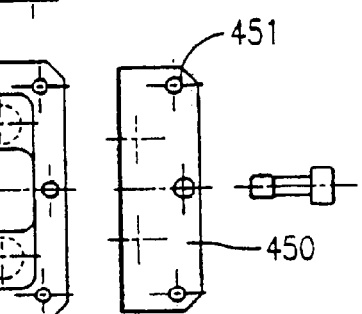
FIG. 19C  FIG. 19A

PARALLEL ALIGNING QUICK DISCONNECT ARTICULATED CHUCK APPARATUS AND METHOD

RELATED APPLICATIONS

This is a Divisional Application of application Ser. No. 09/335,590 filed Jun. 18, 1999, now U.S. Pat. No. 6,224,121.

FIELD OF THE INVENTION

The present invention relates to an apparatus for electrically testing electronic chip parts, commonly known as a devices under test (DUT), such as semiconductor bare chips before packaging them into devices, and, more particularly, to a quick disconnect articulated chuck located on the robotic arm which is used to transfer the chip parts from carrier boats to an electrical probe head of a chip tester.

DESCRIPTION OF THE RELATED ART

A vital step in manufacturing electronic chips is testing the completed chips. This testing is typically accomplished by robotic chip handlers wherein the chips are plugged into a test socket, tested and then removed from the test socket, all automatically. Thereafter, the handler sorts the chips according the information obtained in the testing sequence that it receives from the computer making the tests.

In a typical test, a number of chips to be tested are placed on carrier boats which are moved through one or more preconditioning steps, a test step, and optional post conditioning steps. The preconditioning steps generally involve bringing the chip to the test temperature. Following preconditioning, the chip in the test step is positioned so as to be engaged by a chip nest plate on a robotic handler arm. The chip nest aligns with test contactor pins on the electrical test station for contact with the pins of each chip to be tested for supplying and receiving the test signals from the device.

As chips have become more intricate and as chip geometries have shrunk in recent years, the task of handling these chips and aligning the chips for electrical test has become more demanding. At the same time, it is common practice to operate the automatic testers essentially continuously. The two principal problems are in assuring a proper alignment between the chip and the contactor pins for every device, and to perform this task in a manner that reduces mechanical wear on the device handling and testing components. To the extent that there is wear, it is desirable to minimize the disruption to the testing operation by providing a quick disconnect capability for the components most likely to require replacement. The objectives of the current invention include providing an articulated chuck for improving the alignment of the test components, and to provide a quick-disconnect capability for that chuck to permit rapid substitution for that part to minimize production downtime.

An exemplary chip tester comprises a compartment for holding a plurality of chip carrier boats at temperature. Typically, the four robotic arms of the chip tester each obtain one or two chips at a time from the boats and hold these chips in place as the arms rotate 90 degrees to present those chips to respective electrical test stations. The robotic arms typically include a chuck assembly which is designed to provide a vacuum to hold the chip or chips in place during transport and testing. The chuck assembly also assists in the alignment of the chips to the electrical test station.

In prior art, alignment was typically obtained by a combination of alignment pins and bushings between the chuck assembly and the electrical test head, and final alignment was obtained by forcing the chuck assembly to mate with the electrical test head. In high speed, repetitive, testing operations, this alignment scheme resulted in accelerated wear of the chuck assembly and in relatively high rates of test misalignment and in damaged chips and equipment. The replacement of the chuck assembly required a partial disassembly of the robotic head to access the part. In the current invention, wear is substantially reduced by improving the alignment between the chuck assembly and the electrical test head, the required alignment mating forces are reduced, testing efficiency is improved, chuck replacement time is substantially reduced, and the chuck may be replaced without disassembling the robotic arm mechanism.

The prior art includes references to chip guides for positioning the chip onto the stage of test device. U.S. Pat. No. 5,561,386 issued Oct. 1, 1996 to Funaki, et al entitled "Chip tester with improvements in handling efficiency and measurement precision" describes a chip tester including a chip guide.

U.S. Pat. No. 5,828,223 entitled "Universal chip tester interface device" issued Oct. 27, 1998 to Rabkin et al. describes a robotic test machine for testing chips including a novel interface between the chips being tested and the plunger head loadboard which permits rapid changes of products being tested.

U.S. Pat. No. 5,192,908 entitled "Semiconductor device testing apparatus with positioning mechanism" issued Mar. 9, 1993 to Shibata describes a fourchucking-position electrical test apparatus.

The current invention relates to an improved quick disconnect articulated chuck which may be easily removed from the robotic drive mechanism for service. A real advantage is obtained by enabling a quick change over, resulting in a cost savings both in labor required for maintenance and in reduced production downtime.

It is another object of the invention to provide a quick disconnect capability while improving the accuracy of the chuck.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

SUMMARY OF THE INVENTION

In a typical electronic test environment, a robotic test machine is used to remove individual chips from a boat and to place each chip in the position that can be probed in an electrical test. This test may be conducted at the ambient temperature, or at reduced or elevated temperature in a controlled environment.

In order to use standard test equipment for a variety of chip geometries, special tooling in the form of a chuck which supports various chip nests is typically used to support various chip sizes in alignment with electrical test machine. When a device is changed, its unique chip nest is typically placed at the end of the chuck. In the current invention, a rigid chuck is replaced by a quick-disconnect articulated chuck which connects the chip nest to the robotic shaft in a manner that provides alignment accuracy, flexibility, and a vacuum attachment means to assistant capturing and containing the chip. The chuck supports the various chip nests which are typically unique for each size of chip.

The robotic test machines are subject high usage rates, in there is often a need for maintenance or replacement of the tooling. Typically, it is necessary to remove the plunger head in order to access the chuck. It is also frequently necessary to remove portions of the robotic support arm, including support springs, in order to disassemble a conventional chuck. An objective of the present invention is to provide a novel design wherein the chuck may be removed quickly without removing the plunger head. Since the chuck is often difficult to access, the quick disconnect capability provides significant labor savings and production downtime avoidance.

The preferred embodiment of the chuck is comprised of a chuck base housing which typically remains attached to the robotic arm; and a quick disconnect assembly. The quick disconnect assembly includes a vacuum sealing means, a retractable piston with vacuum cup attachment for securing a chip, a plunger head, alignment pins, and accessible captive disconnect screws. The base housing is mounted in a manner that permits articulation of the chuck to allow the chuck to obtain better alignment with the electrical test fixture; and a vacuum introduction means.

In an alternate embodiment, which is designed to permit a low-force alignment before substantial mating forces are applied between the chuck and a test fixture, a roller ball and detent mechanism featuring a mechanical home position is employed. The roller balls permit relatively low forces of the initial mating action between the chuck and the fixture to move the chuck into a position of better alignment, and therefore lower stress and wear. This initial movement is parallel to the plane of the test fixture to minimize binding of the chuck.

In alternative embodiments, the chuck may be a single piece improved parallel articulating chuck, or a simplified one-piece quick disconnect chuck.

BRIEF DESCRIPTION OF THE DRAWINGS

The accompanying drawings, which are incorporated in and constitute a part of the specification, illustrate the preferred embodiments of the invention and, together with the general description given above and the detailed description of the preferred embodiments given below, serve to explain the principles of the invention.

FIG. 5A is an exploded top view of a small nipple articulated chuck disconnect housing and chip nest;

FIG. 5B is an end view of a small nipple articulated chuck disconnect housing and chip nest;

FIG. 11A is a partially exploded end view of the slide rail assembly;

FIG. 11B is a side view of a partially exploded view of the slide rail assembly;

FIG. 11C is a detail end view of the parallel aligning chuck base;

FIG. 13A is a end view of a linear side rail and detents;

FIG. 13B is a detail end view a linear slide rail detent;

FIG. 13C is a detail side view a linear slide rail detent;

FIG. 15A is an end view of the parallel aligning quick disconnect chuck plunger head;

FIG. 15B is a partially exploded side view of the parallel aligning quick disconnect chuck plunger head;

FIG. 15C is an end top view of the parallel aligning chuck base;

FIG. 15D is a partially exploded top view of the parallel aligning chuck base;

FIG. 16A is side view of a one-piece parallel aligning quick disconnect chuck;

FIG. 16B is a partially exploded top view of a one-piece parallel aligning quick disconnect chuck;

FIG. 16C is a partially exploded end view of a one-piece parallel aligning quick disconnect chuck;

FIG. 16D is a partially exploded second side view of the plunger assembly of a one-piece parallel aligning quick disconnect chuck;

FIG. 16E is a partially exploded top view of the slide rail assembly of a one-piece parallel aligning quick disconnect chuck;

FIG. 19A is an exploded top view of a linear slide rail for a one-piece parallel aligning quick disconnect chuck;

FIG. 19B is a top view of a linear slide rail for a one-piece parallel aligning quick disconnect chuck;

FIG. 19C is an exploded side view of a linear slide rail for a one piece parallel aligning quick disconnect chuck;

DETAILED DESCRIPTION OF THE PREFERRED EMBODIMENT

Figure 1A:
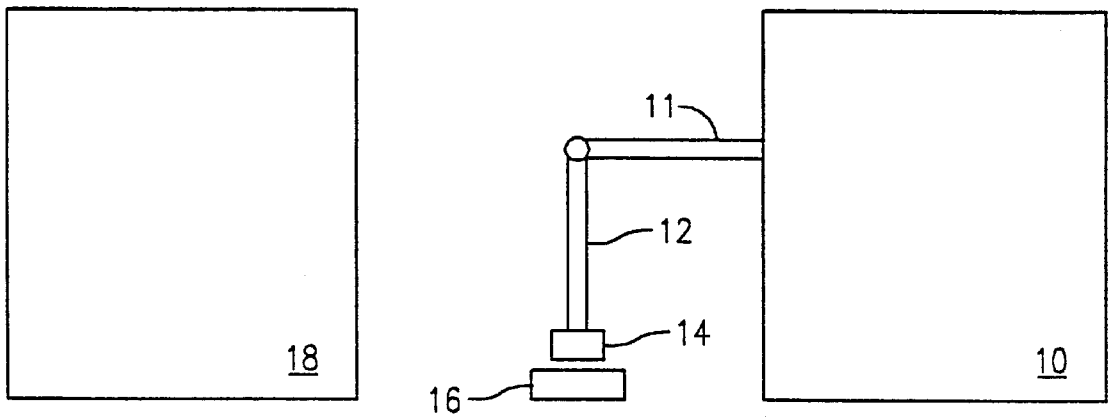
FIG. 1A and 1B are simplified block diagrams of an exemplary chip tester illustrating the relation of the chuck to the semiconductor test apparatus.
Figure 1B:
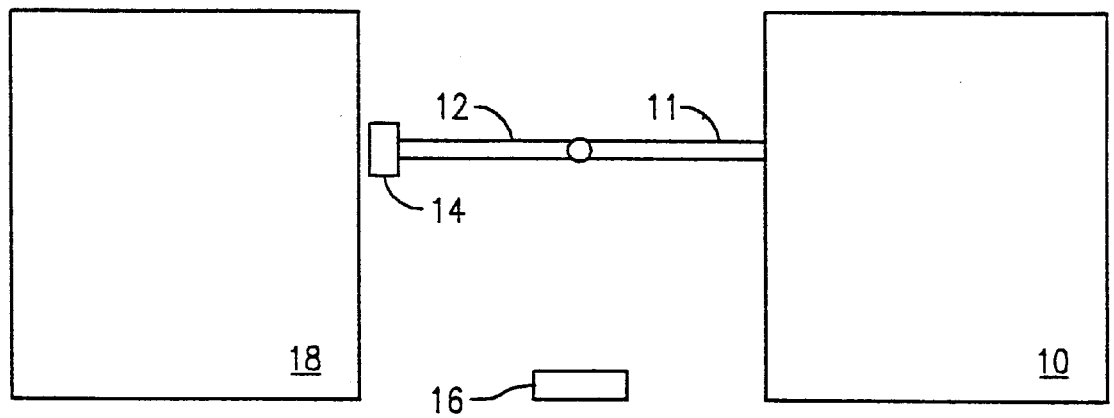
Figure 2A:
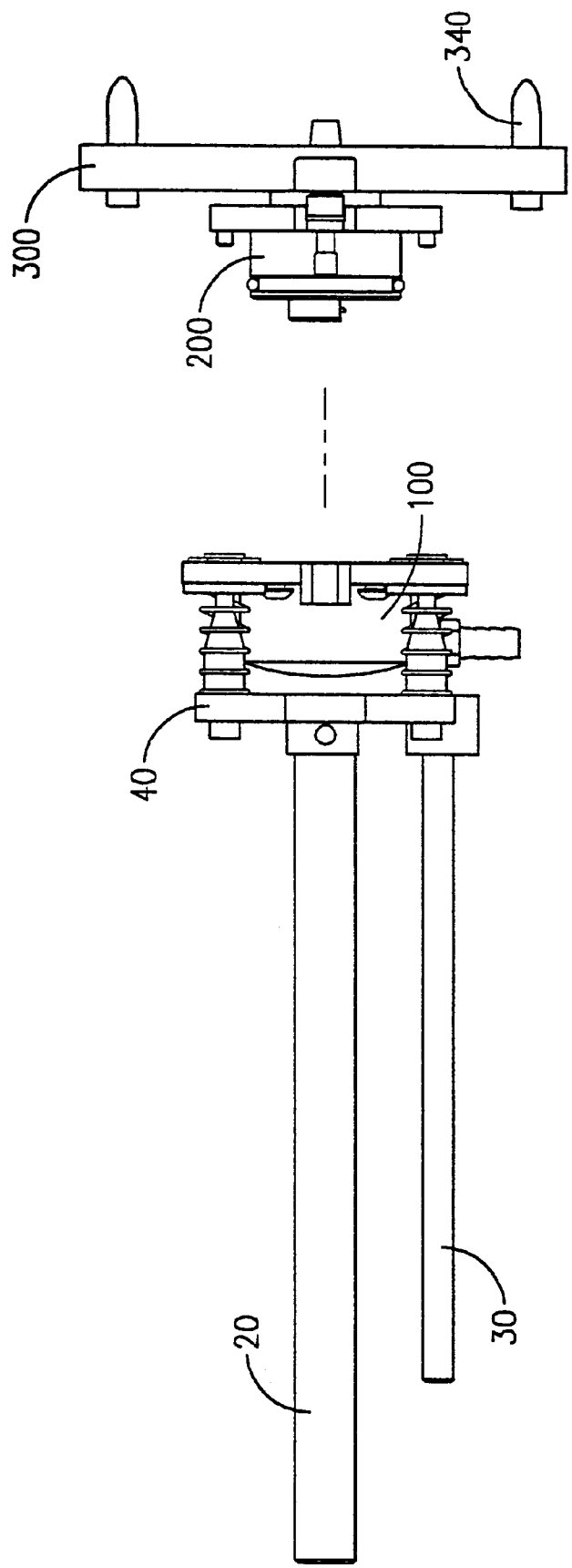
FIG. 2A is a partially exploded side view of the articulated chuck assembly.
Figure 2C:
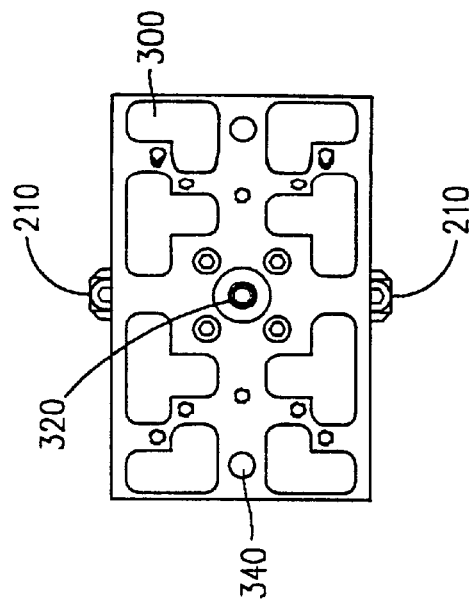
FIG. 2C is a front view of the articulated chuck assembly.
Figure 2B:
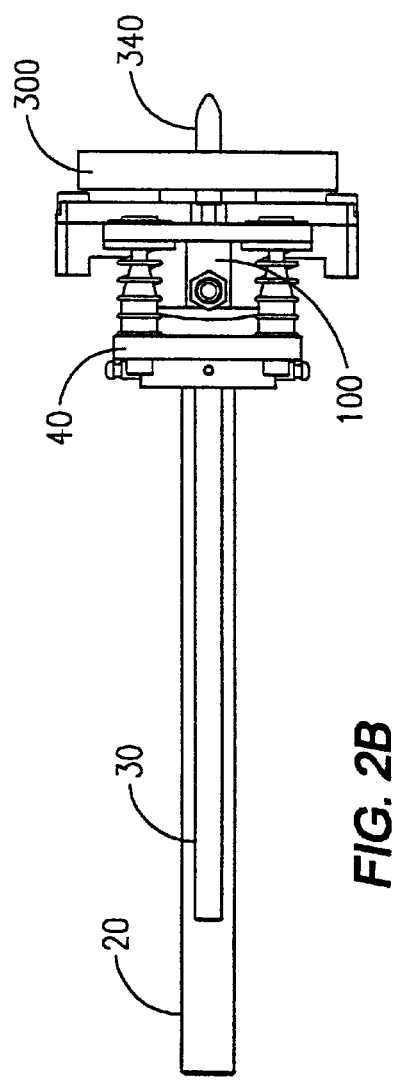
FIG. 2B is a top view of the articulated chuck assembly.
Figure 3:
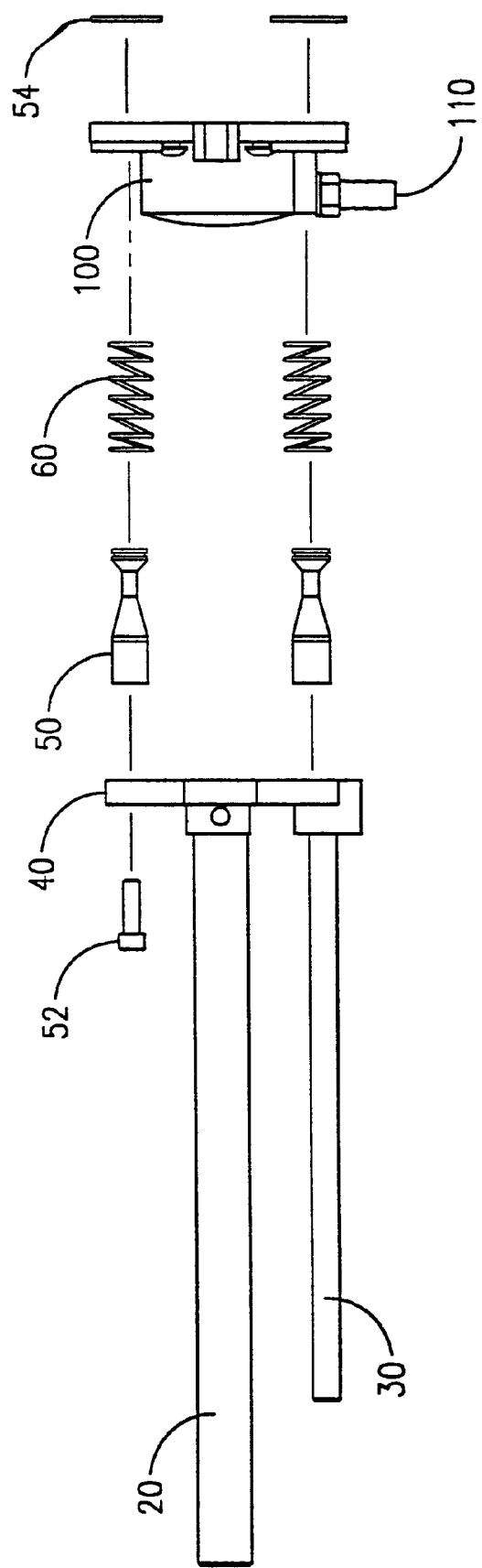
FIG. 3A is an exploded side view of the articulated chuck base housing and the backshafts.

The following description refers generally to the preferred embodiment of a quick disconnect articulated chuck for a Delta Design UTS Flex test machine. Referring now to FIG. 1A, which is a block diagram illustrating the test function, a manipulator 10 has a pivoted robotic arm 11 and 12, with an articulated chuck 14. The chip is preferably seated within a polymeric chip nest attached to the end of the articulated chuck, and held in the nest with the assistance of a vacuum cup which accesses the chip through a hole in the chip nest. In each cycle, one or more chips is removed from a boat 16 when the vacuum cup is moved within the proximity of the chip and a vacuum is applied, thereby drawing the chip into the chip nest. Referring now to FIG. 1B, the manipulator then delivers the chip to a test station 18, where the chip is electrically tested. At this point, alignment pins on the chuck typically mate with bushings on the electrical test fixture. The chip may be returned to the boat or to another location, depending upon the success of the electrical test. Referring now to FIG. 2A, which is a partially exploded side view of the articulated chuck, the quick disconnect assembly 200 and the plunger head 300 form a quick disconnect head subassembly for a large nipple piston embodiment of the current invention. The quick disconnect head subassembly attaches to a base subassembly comprised of a chuck base housing subassembly 100 secured to a mounting plate 40 integral to the large alignment backshaft 20 and the small alignment backshaft 30. Referring now to FIG. 2B, which is a top view of the articulated chuck, the quick disconnect assembly and the plunger head 300 are attached to the a chuck base housing subassembly 100, which in turn is attached to the mounting plate 40 integral to the large alignment backshaft 20 and the small alignment backshaft 30. Referring now to FIG. 2C which is a front view of the articulated chuck, the polymeric chip nest will be aligned with the plunger head 300 by means of the chip nest alignment pins 340. The chip nest and the plunger head 300 and quick disconnect assembly may be removed from the chuck base by removing two easily accessible captive screws 210 which connect the quick disconnect head subassembly to the chuck base. An objective of the current invention is to provide a chuck assembly which provides the articulated support and alignment functions to secure the plunger head to the backshafts, and that can be easily removed without disassembling portions of the robotic arm to access the chuck. The chip is held in the plunger head with a large nipple with a vacuum cup assembly 320. The head includes alignment pins 340 which align the chip nest to the plunger head, and which serve to align the chip nest to the to the electrical testing fixture. Referring now to FIG. 3, which is an exploded side view of the chuck housing assembly, the chuck base housing subassembly 100 is secured to a mounting plate 40 by means of four guide posts 50 and four E rings 54. The guide posts are preferably about 0.918" in length, with a slot located near one end to secure the E ring, and a threaded opening on the other end to accept a #4–40×⅜ inch screw 52 which secures the guide post to the mounting plate. The chuck base housing subassembly 100 includes a threaded vacuum hose attachment 110, which typically accepts a ⅛ inch vacuum hose. A clearance is typically provided between the mounting plate and the chuck base housing, and the housing is typically supported by compression springs 60 which are assembled over the guide posts. These compression springs permit a slight compression of the plunger head against the electrical test probe area. The ability to compress the assembly provides the tolerance for minor alignment adjustment in the alignment of the chip nest to the electrical test probe. Typically this tolerance is about 0.025 inch. The preferred embodiment maintains this tolerance and provides a quick-disconnect capability for replacement of the chuck. Despite this tolerance, there is a need for periodic chuck replacement because the chuck has a tendency to wear due to occasional cocking of the assembly relative to the test fixture and subsequent jamming of the guide pins into the test fixture. To reduce this wear, alternate embodiments are presented which provide greater tolerances of approximately 0.080 inch, and which provide a capability for the chuck to move in a plane parallel to the test fixture.

Figure 4B:
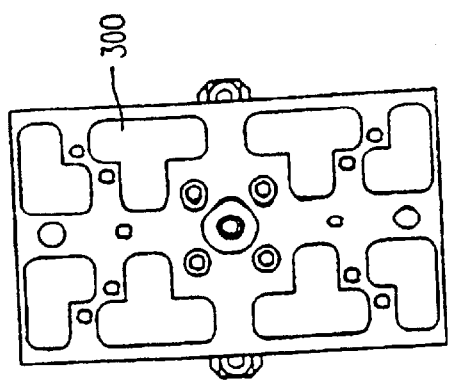
FIG. 4B is an end view of a large nipple articulated chuck disconnect housing and chip nest.
Figure 4D:
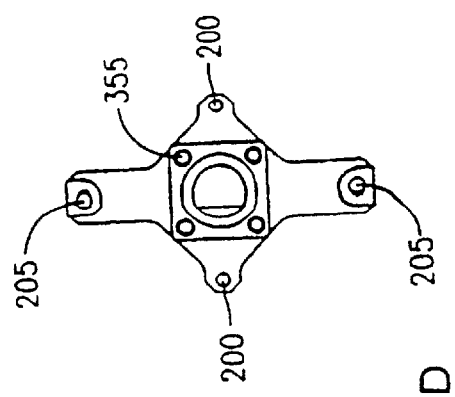
FIG. 4D is a top view of a quick disconnect head subassembly.
Figure 4C:
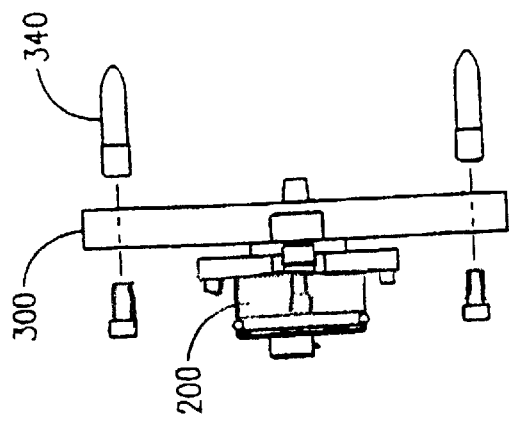
FIG. 4C is an end view of a large nipple articulated chuck disconnect housing and chip nest.
Figure 4A:
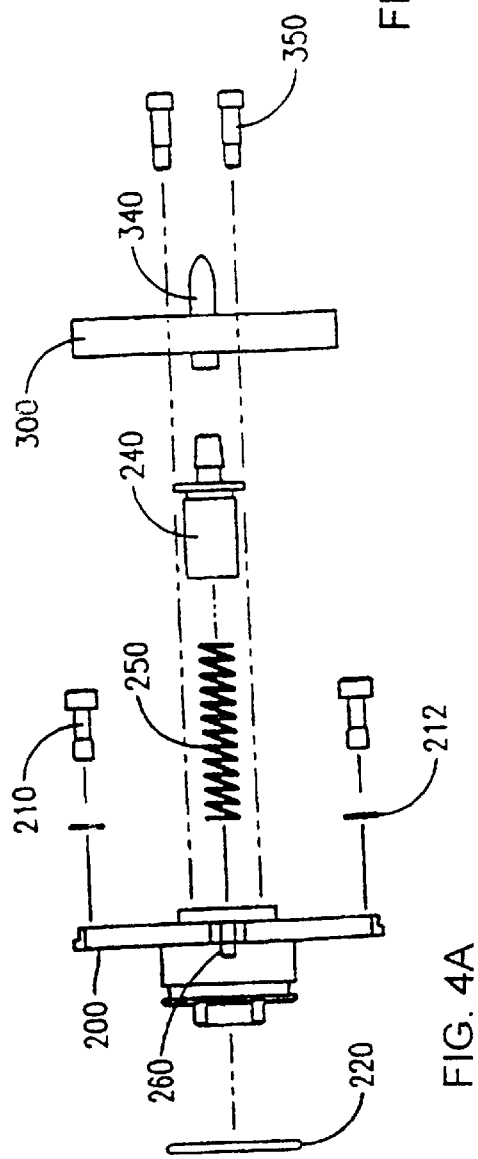
FIG. 4A is an exploded side view of a large nipple articulated chuck disconnect housing and chip nest.
Figure 6:
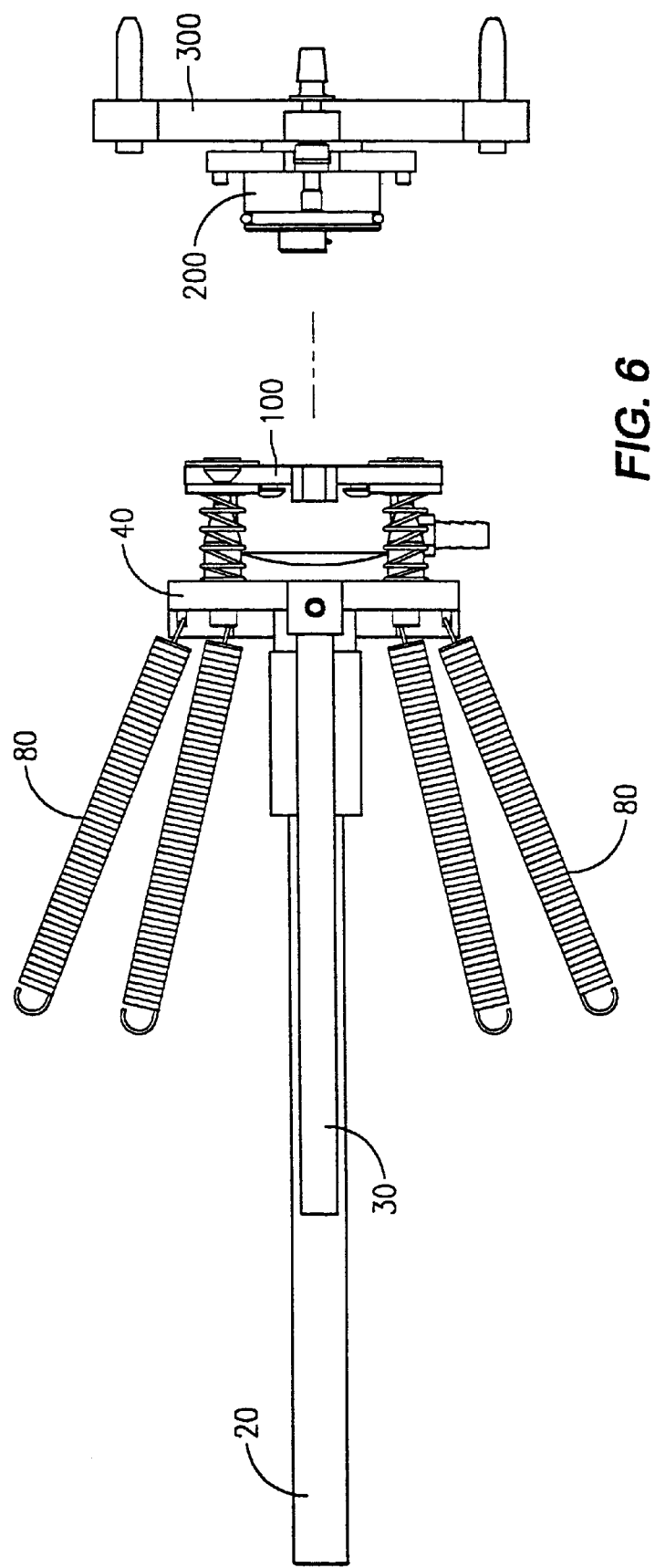
FIG. 6 is a view showing chuck support springs.

The permitted adjustment is in all major axes as well as an angular adjustment. An alternate embodiment described below is designed to permit greater translational and angular alignment adjustment. In prior art, the first motion of the chuck to the electrical test plate is a compression which causes mechanical binding and accelerated wear. Referring now to FIG. 4A, which is an exploded view of the preferred quick disconnect head subassembly, the plunger head 300 is secured to the quick disconnect assembly 200 by means of four shoulder screws 350 which have a minimum clearance fit and which act as both an attachment and an alignment means. The shoulder screws are secured to threaded holes 355 in the quick disconnect assembly. The quick disconnect assembly is attached to the chuck base by means of two captive socket head screws 210 and lock washers 212. The backing out of these two socket head screws will permit the quick disconnect assembly 200 and the plunger head 300 to be removed from the chuck base housing subassembly. The socket head screws are placed through holes 205 in the quick disconnect assembly housing subassembly. The quick disconnect assembly includes an O ring 220 which provides a vacuum seal to the chuck base so that vacuum introduced to the threaded vacuum hose attachment in the chuck base causes the large nipple piston 240 to retract into the quick disconnect assembly. When the vacuum is removed, a compression spring 250, which is preferably a 0.240 inch diameter ×1.25 inch long stainless steel spring, causes the large nipple piston to protrude through a hole in the plunger head and the chip nest so that the piston and a vacuum cup attachment on the piston can be used to obtain a chip and hold the chip in the chip nest. Alignment of the quick disconnect assembly to the chuck base is provided by two dowel pins 260 which fit into dowel pin alignment holes on the base subassembly. Referring now to FIG. 6, which is a side view showing chuck support springs 80, prior art required removal of two to four chuck support springs in order to replace the chuck. The preferred embodiment describes a chuck for an electrical test machine that has two support springs per chuck.

In the current invention, the springs, the mounting plate 40 and the chuck base housing subassembly 100 remain attached to the backshaft alignment arms 20 and 30 while the quick disconnect assembly and the plunger head can be easily removed for rapid service or replacement. This replacement may be required for maintenance of the chuck, or it may be desired for quick substitution of a new chip nest when a new device is to be tested.

ALTERNATE EMBODIMENT—SMALL NIPPLE PISTON

Referring now to FIG. 5A–B, an alternate embodiment of a small nipple piston, is similar in design, except that a small nipple piston 242 is used in place of the large nipple piston.

ALTERNATE EMBODIMENT—OTHER ALIGNMENT AND ATTACHMENT MEANS

While the preferred embodiment of the chuck uses a combination of alignment pins and screws to provide a quick disconnect function, it will be obvious to those skilled in the art to substitute other alignment and attachment means including keys in slots, mating surface edges, tapered wedges, spring toggle clamps, quarter-turn fasteners, slide clips mating in post grooves, ball lock mechanisms, spring latch clips, and similar devices.

ALTERNATE EMBODIMENT—PARALLEL ALIGNING QUICK DISCONNECT CHUCK

This alternate embodiment describes a parallel aligning chuck assembly with improved alignment capability.

Figure 7A:
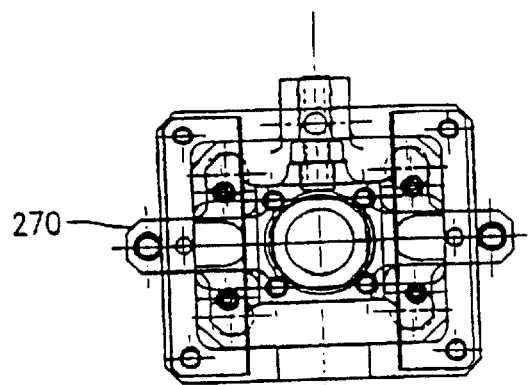
FIG. 7A is a top view of a parallel aligning quick disconnect chuck.
Figure 7B:
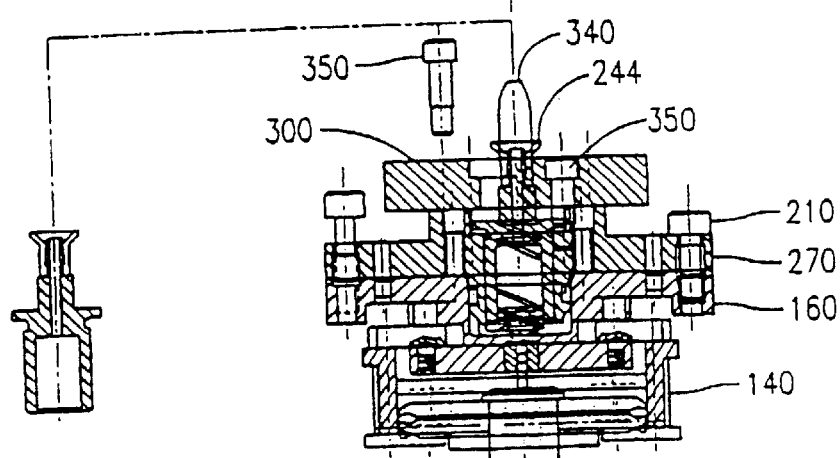
FIG. 7B is an end view of a parallel aligning quick disconnect chuck.
Figure 7C:
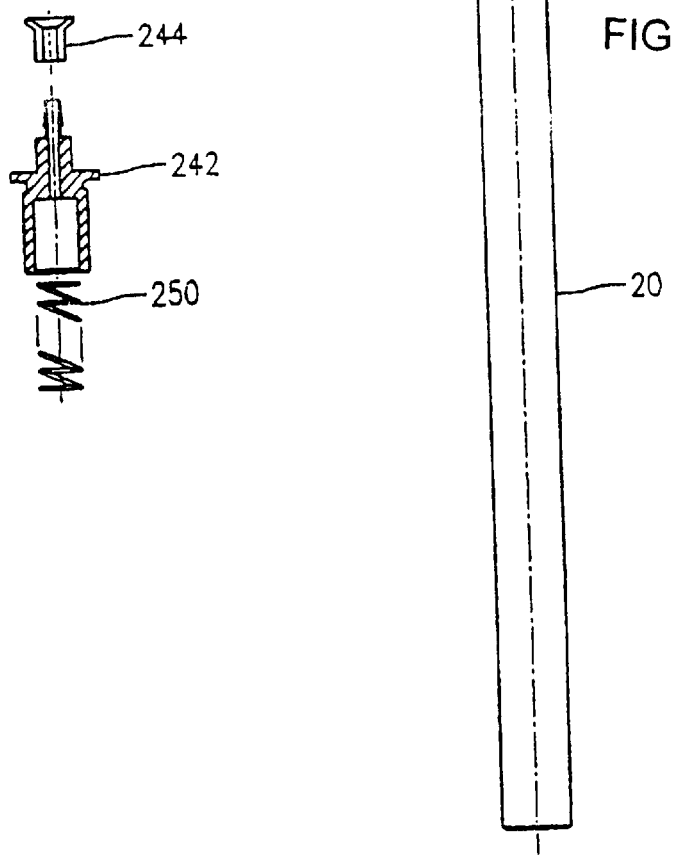
FIG. 7C is an exploded detail top view of the retractable piston.

Referring now to FIG. 7A–C is designed to provide dimensional variation adjustment means to compensate for thermal expansion or contraction dimensional variations and other unintentional dimensional variations which cause misalignment between the chip and the electrical test fixture. Easily accessible captive quick disconnect bolts 210 permit removal of the quick disconnect portion of the chuck which includes a plunger head 300 and a retractable piston 242 with a vacuum cup 244 for gripping a chip in a chip nest. The plunger head preferable contains alignment pins 340 which engage bushings in the electrical test fixture. The design of the chuck is independent of the fixture alignment scheme, and other alignment guiding methods may be substituted for the pin and bushing embodiment.

The parallel aligning articulator assembly is the portion of the device which remains on the handler when the quick disconnect chuck assembly is removed. This assembly includes a linear slide frame 140, a back shaft assembly, linear slide rails, a parallel aligning chuck base 160, thread inserted quick disconnection bolt holes, quick disconnection alignment pin sockets, a vacuum source connection, and the device's linear motion members held at base point by four base point alignment detents. The device's linear motion members are engaged over the return to base point torsion spring which causes the linear motion members to engage on the four base point alignment detents after a force is applied to cause linear, transverse, or rotational movement of these members. In this embodiment, the chuck may obtain an alignment correction as it is compressed, thereby reducing wear.

The chuck's movement may be linear, transverse, and rotational in a plane parallel to the mating surface plane of the electrical test fixture. The chuck also includes a means of adjusting the plane of the chip to match the plane of the electrical test fixture. The chuck's parallel alignment feature assists in preventing the usual pin to bushing binding and resulting wear and damage that has heretofore occurred in the action of engaging pins and bushings between the chip and the tester.

The chuck's improved pin to bushing and mating test contact features large-area load bearing surfaces to distribute impact loading, improved positioning accuracy between the mating test points, improved mechanism life, and improved chip testing efficiency. The chuck also includes a quick disconnect means which permits removal of the plunger head without disrupting the vacuum line or the mechanical connections of the chuck to the device handler. The device is interchangeable with existing chip handling articulating devices through the backshaft alignment rods, the vacuum connection, and extension spring mounting posts.

Figure 8A:
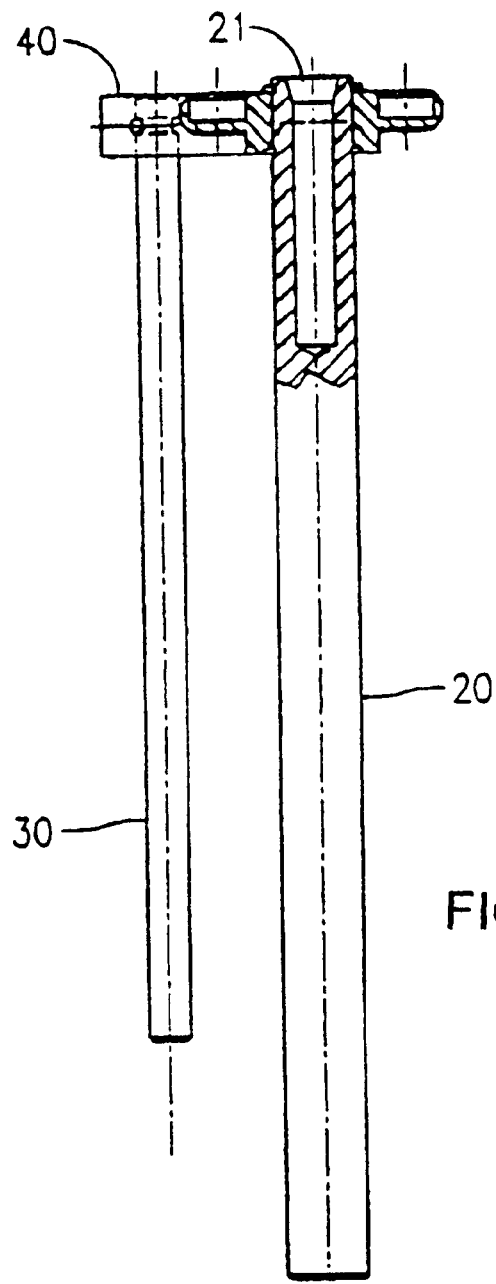
FIG. 8A is a side view of the back shaft assembly of the parallel aligning quick disconnect chuck.
Figure 8B:
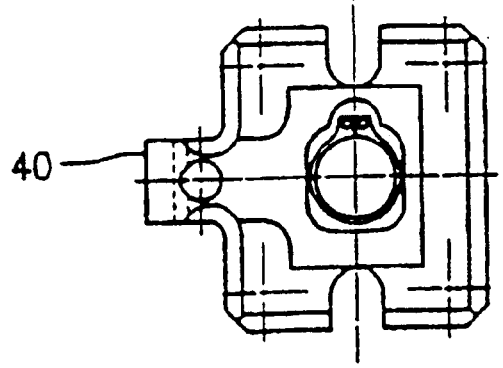
FIG. 8B is an end view of the back shaft assembly of the parallel aligning quick disconnect chuck.

Referring now to FIG. 8A, which is a side view of the back shaft assembly includes a large backshaft alignment rod 20, a small backshaft alignment rod 30, and a back shaft assembly mounting plate 40. The large backshaft alignment rod is recessed 21 to receive a torsion spring.

Figure 9:
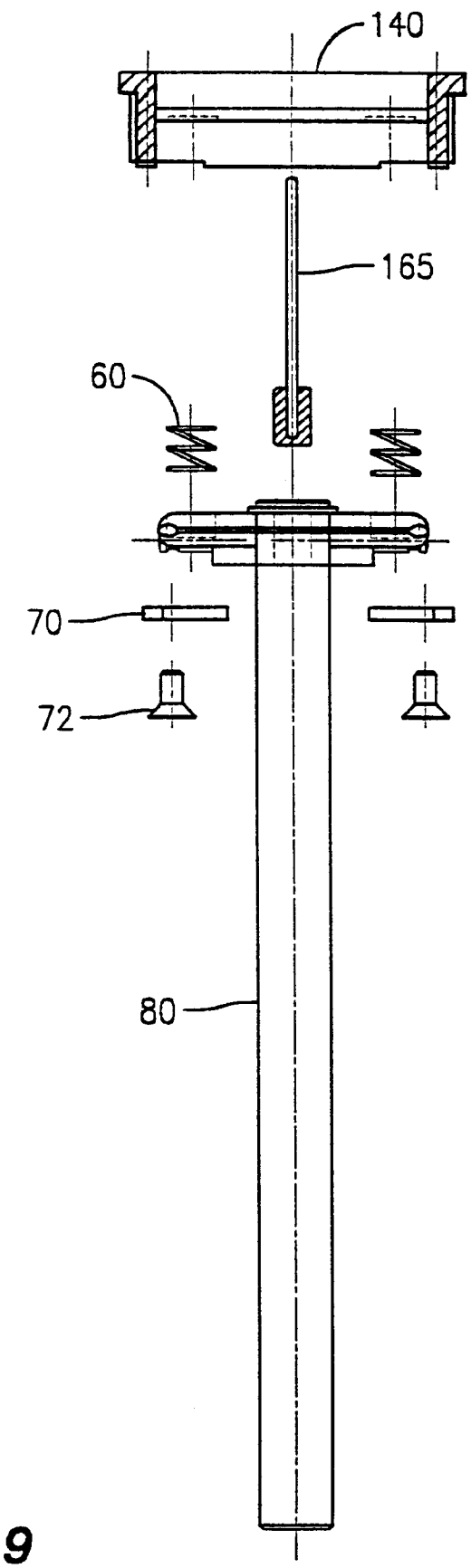
FIG. 9 is an exploded top view of the linear slide frame assembly of the parallel aligning quick disconnect chuck.

Referring now to FIG. 9, which is a top view of the linear slide frame assembly, the parallel aligning articulator assembly is the portion of the device which remains on the handler when the quick disconnect chuck assembly is removed. A linear slide frame 140 is secured to the back shaft assembly 80 with flat head socket screws 72 and stop tabs 70. Compression springs 60 provide an offset between the linear slide frame and the back shaft assembly mounting plate. The torsion spring 165 and lower bushing fit into the large backshaft alignment rod. A torsion spring 165 having a preferred length of 1.365 inch and diameter of 0.054 inch, with rounded ends, assists the mechanism to return to its mechanical zero when mating forces are released.

Figure 10B:
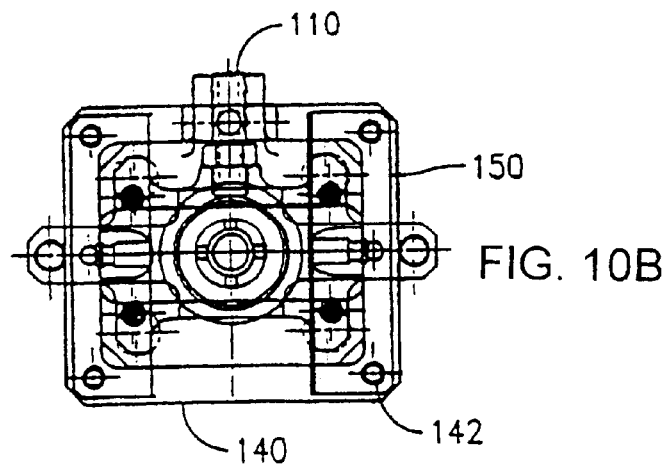
FIG. 10B is an end view of the parallel aligning chuck base.
Figure 10A:
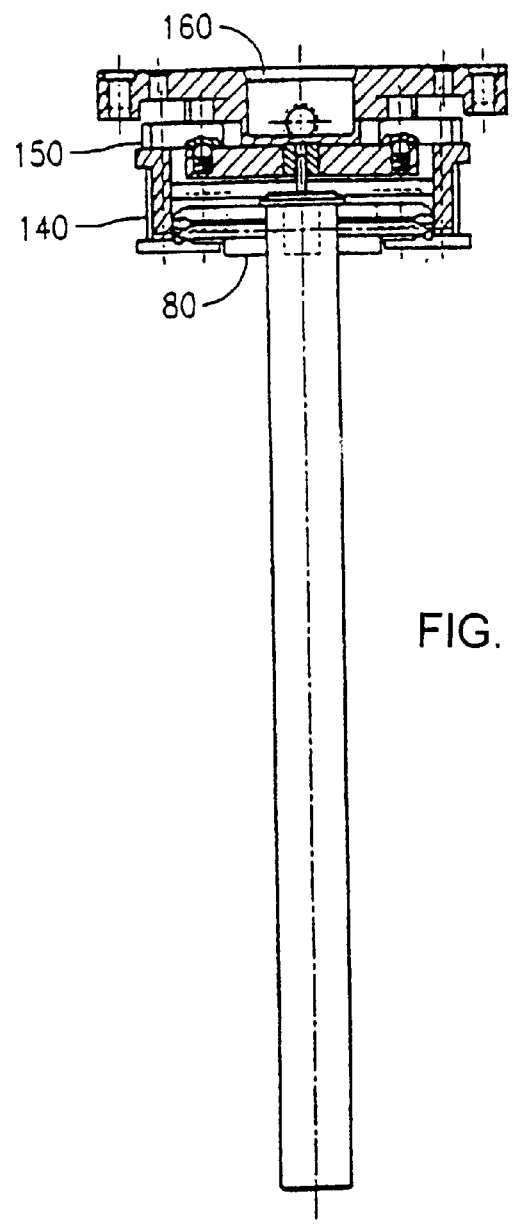
FIG. 10A is a top view of the parallel aligning chuck base.

Referring now to FIG. 10A, which is a top view of the parallel aligning chuck base 160, and to FIG. 11 A which is a partially exploded view of the slide rail assembly, the linear slide rails 150 are attached to the linear slide frame 140 with shoulder screws 142 and washers 143.

Figure 12B:
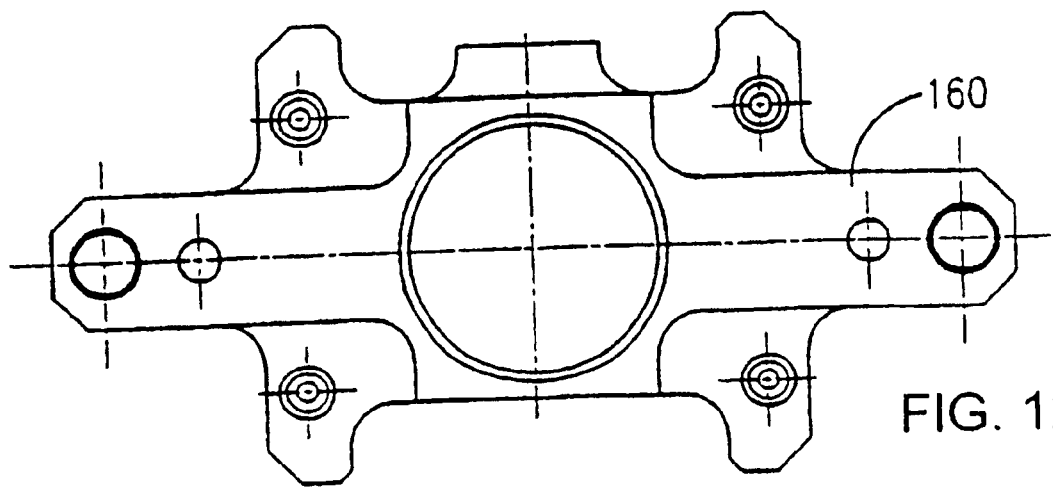
FIG. 12B is an end view of the parallel aligning chuck base.
Figure 12A:
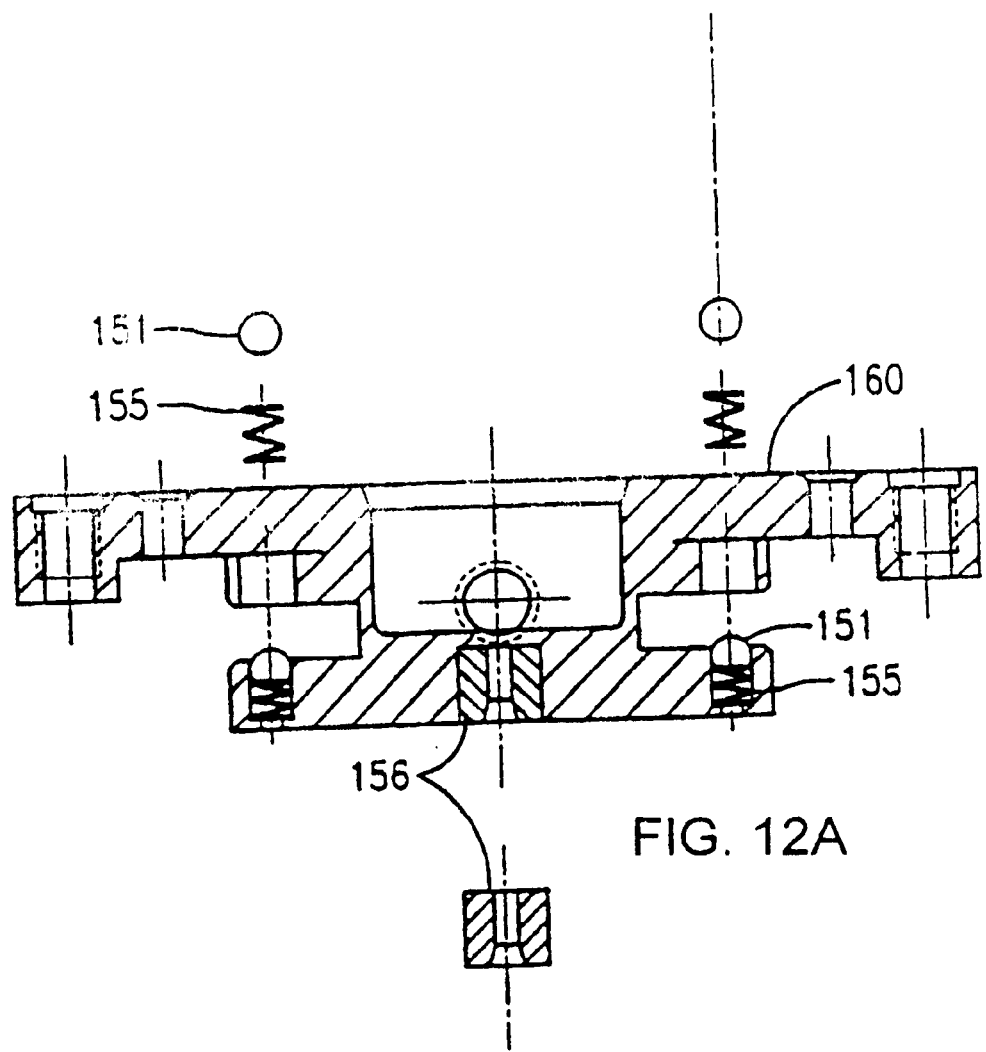
FIG. 12A is a detailed side view of the parallel aligning chuck base.
Figures 14A, 14B, 14C, 14D:
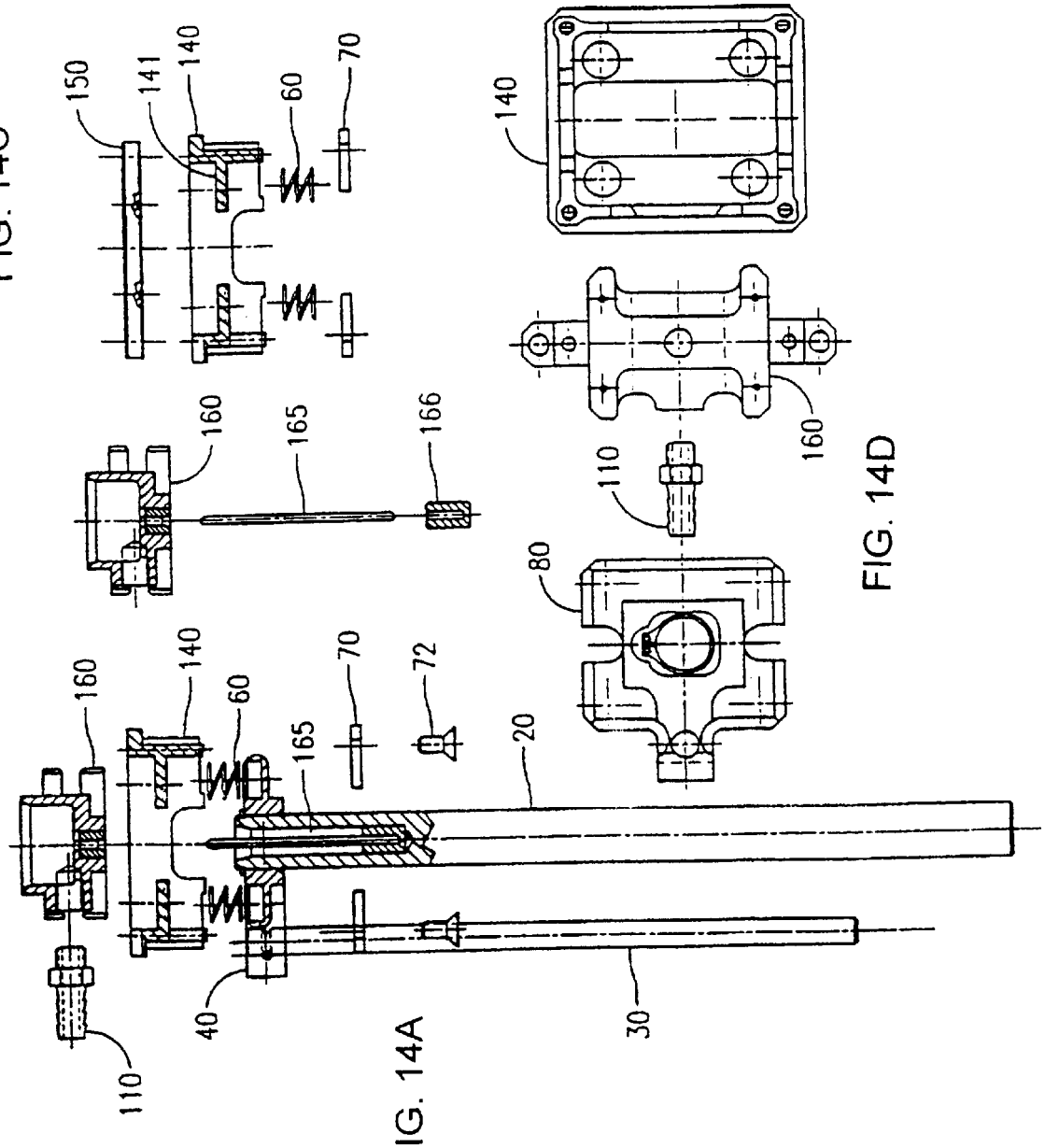
FIG. 14A is a partially exploded side view of the parallel aligning chuck base.
FIG. 14B is an exploded side view of the parallel aligning chuck base.
FIG. 14C is an exploded side view of the linear slide frame for the parallel aligning chuck base.
FIG. 14D is a partially exploded end view of the parallel aligning chuck base.
Figure 17C:
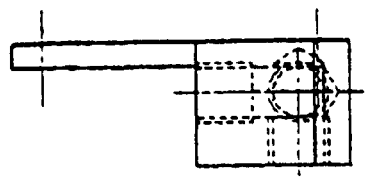
FIG. 17C is a top view detail of a vacuum adapter for a one-piece parallel aligning quick disconnect chuck.
Figure 17B:
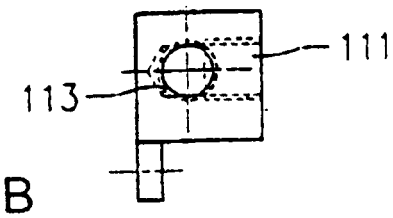
FIG. 17B is a side view detail of a vacuum adapter for a one-piece parallel aligning quick disconnect chuck.
Figure 17A:
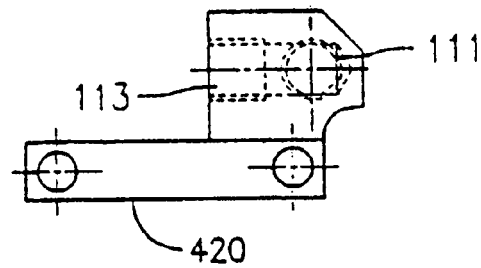
FIG. 17A is an end view detail of a vacuum adapter for a one-piece parallel aligning quick disconnect chuck.
Figures 18A, 18B, 18C, 18D, 18E:
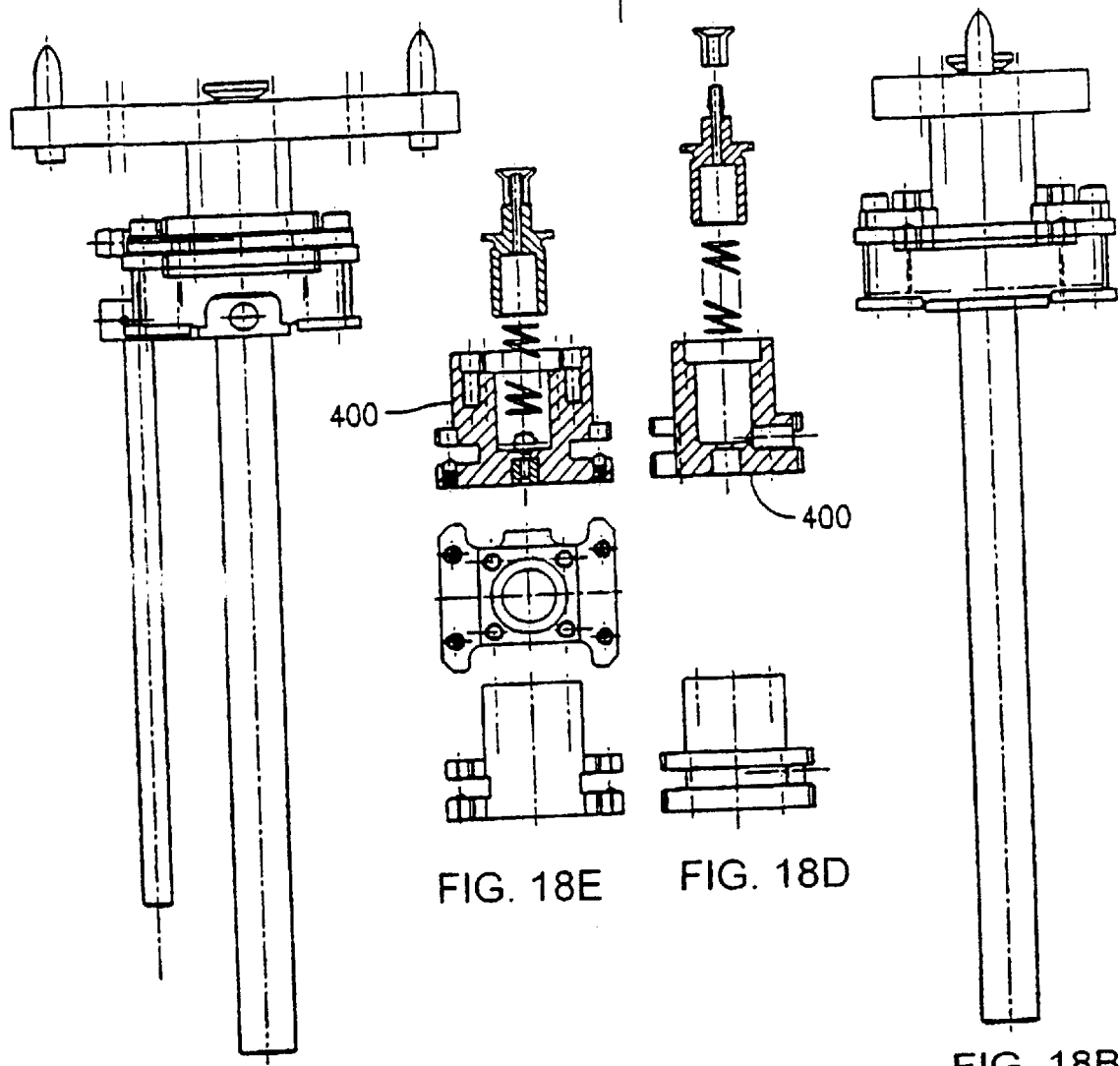
FIG. 18A is a side view of a one-piece parallel aligning chuck
FIG. 18B is a top view of a one-piece parallel aligning chuck.
FIG. 18C is a detailed end view of a one-piece parallel aligning chuck
FIG. 18D is a partially exploded top view of a one-piece parallel aligning chuck.
FIG. 18E is a partially exploded side view of a one-piece parallel aligning chuck.

Referring now to FIG. 12A which is a detail of the parallel aligning chuck base, the slide mechanism includes four precision ball compression springs 155 and precision balls 151 which are designed to travel within detents located on the linear slide rails. The precision balls 151, which have a preferred diameter of 0.09375 inch, roll in a recessed portion of linear slide rails in a manner that creates a mechanical zero position with base point alignment detents, but which permits the chuck linear motion frame member to translate.

Referring now to FIG. 13A–C which is a detail of the linear slide rail and detent sockets, the base point alignment detent sockets 152 preferably have a detent home position 153 of preferred spherical radius 0.047 inch, and a detent travel area 154 of preferred radius of 0.187 inch, such that the precision balls will tend to seek a home position within the smaller radius recession, but are free to travel with little resistance within the larger radius to permit proper alignment of the device.

Referring now to FIG. 14A–D, which is a side view of the parallel aligning chuck base, The linear slide rail 140 mounts with a slidable fit around the back shaft assembly face plate guide surfaces and is spring clamped to the face plate 40 with four springs 60 held by spring clamp bars 141 on the linear slide frame 140. The face plate's guiding surfaces and the four clamp bar held springs provide the slide frame's mating positioning feature for adjusting the plane of the chip test points to match the plane of the tester. The linear motion mechanism includes slide frame rails 150 which have sockets for the base point alignment detents.

Referring now to FIG. 15A–D which is detail of the parallel aligning quick disconnect chuck, a two part vacuum gripping chuck with a quick disconnect means permits the chip holding end of the chuck to be removed from the remainder of the fixture without disturbing the vacuum source, the extension springs, or the back shaft rod.

What is claimed is:

1. A quick disconnect articulated chuck apparatus to hold and align a device under test (DUT) on a manipulator, the chuck apparatus comprising:

a chuck base housing including
a mounting plate integral to the manipulator,
a vacuum introduction port,
a parallel aligning chuck base incorporating a plurality of roller balls,
at least one linear slide rail incorporating a roller ball detent mechanism comprised of a plurality of essentially concentric depressions, each depression having at least one radius of curvature such that the deepest portion of the depression represents the home position for a corresponding roller ball, and
a linear slide frame such that the slide frame is integral to the slide rail and such that the linear slide rail is supported by a plurality of compression springs positioned between the mounting plate and the linear slide frame, such that the detent mechanism defines a mechanical home position and permits a low-force alignment adjustment to align the chuck with an external fixture and the compression springs provides an angular alignment of the chuck with respect to the fixture; and a detachable chuck assembly comprising
a plunger head for securing at least one device under test,
a retractable piston with a vacuum cup attachment, such that the vacuum cup is connected to the chuck base housing vacuum introduction port, and such that in an extended position, the piston protrudes through at least a portion of an opening in the plunger head in order to reach a device, and in the retracted position, the piston may hold a device in place with the assistance of a vacuum drawn upon the vacuum cup,
a quick disconnect assembly housing including at least two alignment pins, the pins corresponding to bushings on the chuck base housing, and at least two screws to secure the detachable chuck assembly to the chuck base housing, such that the screws are accessible without removing the plunger head and without removing portions of the chuck base housing or manipulator.

2. The quick disconnect articulated chuck of claim 1 wherein a vacuum sealing means is provided to seal between the chuck base and the detachable chuck assembly.

3. An articulated chuck apparatus to hold and align a device under test (DUT) on a manipulator, the chuck apparatus comprising:

a mounting plate integral to the manipulator;
a parallel aligning chuck base including
a vacuum introduction port,
at least one linear slide rail,
a linear slide frame, such that the slide frame may move with respect to the slide rail in order to permit alignment of the chuck to an external fixture,
a plunger head for securing at least one device under test,
a retractable piston with a vacuum cup device holding means; and a spring-mounted chuck base attachment mechanism for mounting the parallel aligning chuck base on the mounting plate, such that the movement of the slide frame with respect to the linear slide rail permits the chuck to make positional adjustments in all principal axes of the mounting plate, and the spring-mounted mechanism permits the chuck to make adjustments to change the angle of the mounting plate relative to an external plane.

4. The chuck of claim 3 wherein
the slide rail is supported by plurality of roller balls located between the linear slide rail and the linear slide frame, such that each roller ball is supported by a spring located between the ball and the linear slide frame; and
the linear slide rail incorporates a roller ball detent mechanism comprised of a plurality of essentially concentric depressions, each depression having at least one radius of curvature such that the deepest portion of the depression represents the home position for a corresponding roller ball.

5. An articulated chuck apparatus to hold and align a device under test (DUT) on a manipulator, the chuck apparatus comprising:

a mounting plate integral to the manipulator;
a parallel aligning chuck base including
a vacuum introduction port,
at least one linear slide rail integral to the mounting plate,
a linear slide linear slide rail in order to permit alignment of the chuck to an external fixture,
such that the slide rail is supported by plurality of roller balls located between the linear slide rail and the linear slide frame, such that each roller ball is supported by a spring located between the ball and the linear slide frame,
such that the linear slide rail incorporates a roller ball detent mechanism comprised of a plurality of essentially concentric depressions, each depression having at least one radius of curvature such that the deepest portion of the depression represents the home position for a corresponding roller ball,
a plunger head for securing at least one device under test,
a retractable piston with a vacuum cup device holding means; and a spring-mounted chuck base attachment mechanism for mounting the parallel aligning chuck base on the mounting plate, the mechanism comprising four sets of mounting pins, compression springs, and retaining rings such that
each mounting pin is integral and substantially perpendicular to the mounting plate,
each mounting pin is inserted through a bushing on the parallel aligning chuck base and secured by a retaining ring, and
a compression spring is positioned over each mounting pin between the base plate and parallel aligning chuck base, such that the springs act to push the parallel aligning chuck base against the retaining rings, and such that the mounting mechanism provides an alignment tolerance to align the chuck apparatus to an external fixture, such that the movement of the slide frame means with respect to the slide rail permits the chuck to make positional adjustments in all principal axes of the mounting plate, and the spring-mounted mechanism permits the chuck to make adjustments to change the angle of the mounting plate relative to an external plane.

6. A quick disconnect articulated chuck apparatus to hold and align a device under test (DUT) on a manipulator, the chuck apparatus comprising:

a chuck base housing including
  a mounting plate integral to the manipulator,
  a first vacuum port, such that a vacuum may be introduced to the first port,
  a second vacuum port, connected to the first vacuum port,
  a parallel aligning chuck base incorporating a plurality of roller balls,
  at least one linear slide rail incorporating a roller ball detent mechanism comprised of a plurality of essentially concentric depressions, each depression having at least one radius of curvature such that the deepest portion of the depression represents the home position for a corresponding roller ball, and
  a linear slide frame such that the slide frame is integral to the slide rail and such that the linear slide rail is supported by a plurality of compression springs positioned between the mounting plate and the linear slide frame, such that the detent mechanism defines a mechanical home position and permits a low-force alignment adjustment to align the chuck with an external fixture and the compression springs provides an angular alignment of the chuck with respect to the fixture; and a detachable chuck assembly comprising
  a third vacuum port and a vacuum hose means connecting the third vacuum port to the second vacuum port, the hose means being of sufficient length to permit removal of the detachable chuck assembly from the chuck base housing and thereby to permit access for removal of the hose means from the third vacuum port,
  a plunger head for securing at least one device under test,
  a retractable piston with a vacuum cup attachment, such that the vacuum cup is connected to the third vacuum introduction port, and such that in an extended position, the piston protrudes through at least a portion of an opening in the plunger head in order to reach a device, and in the retracted position, the piston may hold a device in place with the assistance of a vacuum drawn upon the vacuum cup,
  a means for aligning the detachable chuck assembly to the chuck base housing; and
  a means for attaching the detachable chuck assembly to the chuck base housing, such that the detachable chuck assembly may be removed from the chuck base without removing portions of the chuck base housing or manipulator.

* * * * *